United States Patent [19]
Moriya

[11] Patent Number: 5,568,637
[45] Date of Patent: Oct. 22, 1996

[54] ELECTRONIC DEVICE HAVING PSEUDO-SRAM AND CPU OPERATING IN AN ACTIVE MODE AND IN AN IDLE MODE

[75] Inventor: Kouji Moriya, Higashiyamato, Japan

[73] Assignee: Casio Computer Co., Ltd., Tokyo, Japan

[21] Appl. No.: 262,594

[22] Filed: Jun. 20, 1994

[30] Foreign Application Priority Data

Jun. 28, 1993 [JP] Japan ...................................... 5-157009

[51] Int. Cl.⁶ ........................................................ G06F 1/06
[52] U.S. Cl. ................................................................ 395/550
[58] Field of Search ...................................... 395/550, 750

[56] References Cited

U.S. PATENT DOCUMENTS

| | | | |
|---|---|---|---|
| 4,249,247 | 2/1981 | Patel | 364/DIG. 2 |
| 5,276,843 | 1/1994 | Tillinghast et al. | 364/DIG. 1 |
| 5,369,771 | 11/1994 | Gettel | 364/DIG. 2 |
| 5,371,693 | 12/1994 | Nakazoe . | |

FOREIGN PATENT DOCUMENTS

| | | |
|---|---|---|
| 4234150A1 | 4/1993 | Germany . |
| WO90/16029 | 12/1990 | WIPO . |

OTHER PUBLICATIONS

Electro Conference Record, vol. 18, Apr., 1993, Los Angeles, US, pp. 147–151, Shekar "Pseudo Static Memory, Your Cost Effection Solution To Memory Subsystem Design".

*Primary Examiner*—Thomas M. Heckler
*Attorney, Agent, or Firm*—Frishauf, Holtz, Goodman, Langer & Chick

[57] ABSTRACT

An electronic device uses a pseudo-SRAM having a self-refreshing function, as a memory, and a refresh timing signal having a predetermined period is supplied to the pseudo-SRAM in the operation state of the electronic device. When no key operation is performed with a keyboard for a predetermined period of time, the electronic device switches into an idle mode to stop supply of an operation clock to a CPU and to stop supply of the timing signal to the pseudo-SRAM. When the supply of the timing signal to the pseudo-SRAM is stopped, the pseudo-SRAM operates the self-refreshing function for holding data with low power consumption. When a key operation is detected in the idle mode, a refresh timing signal having a high frequency is supplied to the pseudo-SRAM for a predetermined period of time. Thereafter, the supply of a clock to the CPU is restarted, and the state of the electronic device is returned to a normal operation state.

12 Claims, 4 Drawing Sheets

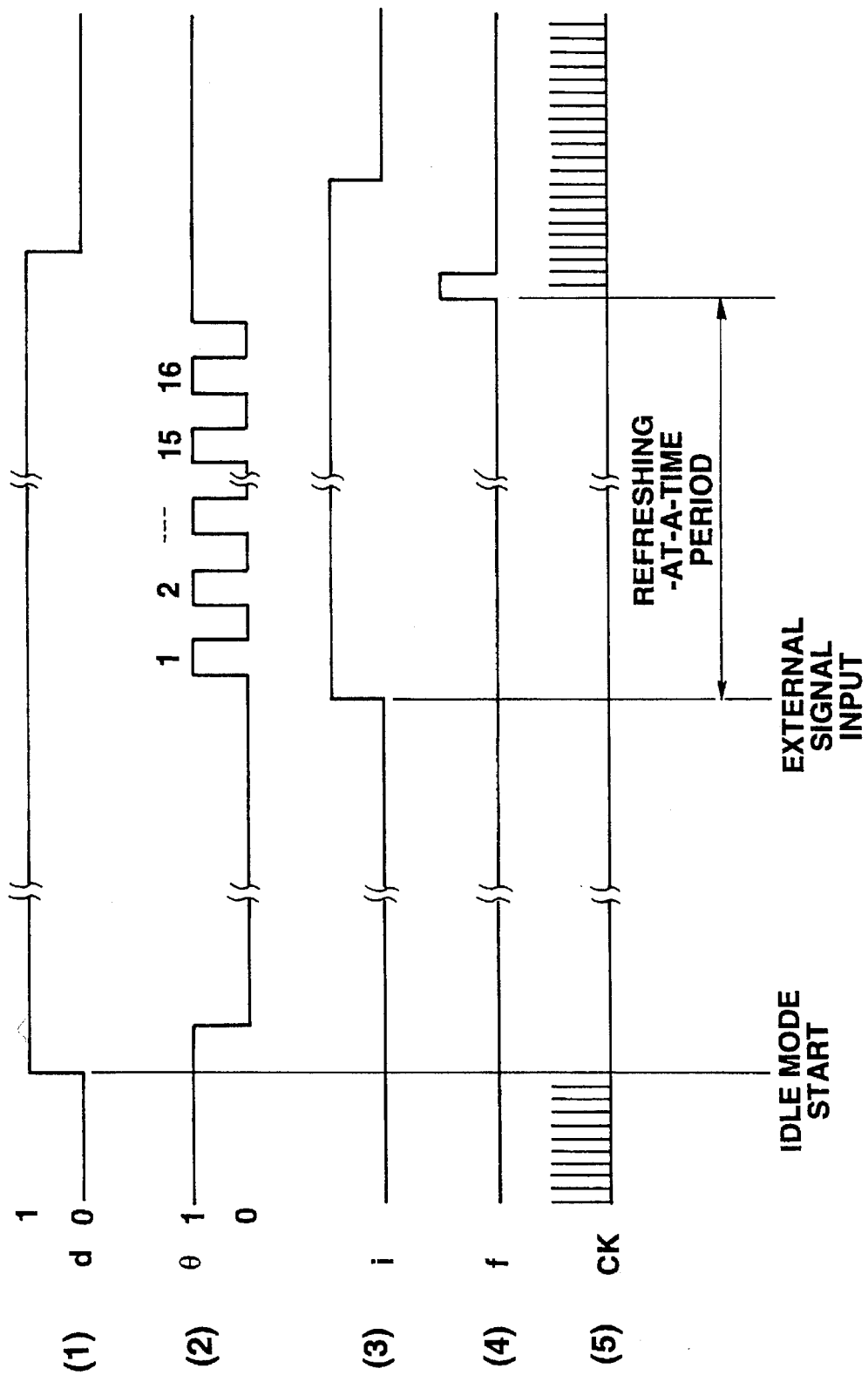

ELECTRONIC DEVICE HAVING PSEUDO-SRAM AND CPU OPERATING IN AN ACTIVE MODE AND IN AN IDLE MODE

BACKGROUND OF THE INVENTION

1. Field of the Invention

The present invention relates to an electronic device such as an electronic notebook or a compact electronic calculator which is driven by a battery power supply and uses a pseudo-SRAM, having a self-refreshing function, as a data memory.

2. Description of the Related Art

In a conventional electronic device such as an electronic notebook or a compact electronic calculator driven by a battery power. supply, when a DRAM which must be refreshed is used as a memory, refresh pulses must be supplied to the DRAM at a predetermined interval. In addition, even in a device using a pseudo-SRAM having a self-refreshing function, although the self-refreshing function is used in a power-off state, the self-refreshing function is not used in a power-on state because timing control is complicated in a normal operation state. Therefore, in the normal operation state or during use of the device, refresh pulses are always supplied to the DRAM or the pseudo-SRAM at a predetermined interval.

However, in such an electronic device using a battery power supply, as in a case wherein a key input operation or communication is not performed for a long period of time in a normal operation state, even when a CPU is not actually operated, clocks and refresh pulses are kept supplied to the CPU and a memory. For this reason, the power of the battery power supply is wasted.

SUMMARY OF THE INVENTION

The present invention has been made in consideration of the above circumstances, and has as its object to provide an electronic device capable of preventing power consumption from being wasted in a state in which a CPU waits for a key input operation for a long period of time even when the power supply of the electronic device is set in an ON state.

More specifically, according to one aspect of the present invention, there is provided an electronic device comprising: a CPU for controlling an operation of the electronic device; a pseudo-SRAM having a self-refreshing function; storage means for storing operation modes of the electronic device; and control means for controlling an operation clock supplied to the CPU in accordance with the operation modes stored in the storage means and controlling a refresh timing signal supplied to the pseudo-SRAM.

According to another aspect of the invention, there is provided an electronic device comprising: key input unit; a CPU for performing a process corresponding to a key operation of the key input unit; a pseudo-SRAM having a self-refreshing function; and refresh timing signal control means for supplying a first refresh timing signal having a predetermined period to the pseudo-SRAM in an operation state of the CPU, and stopping supply of the first refresh timing signal when no key operation is performed with the key input unit for a predetermined period of time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 shows a timing chart for explaining an operation according to this embodiment.

DETAILED DESCRIPTION OF THE PREFERRED EMBODIMENT

Figure 1:
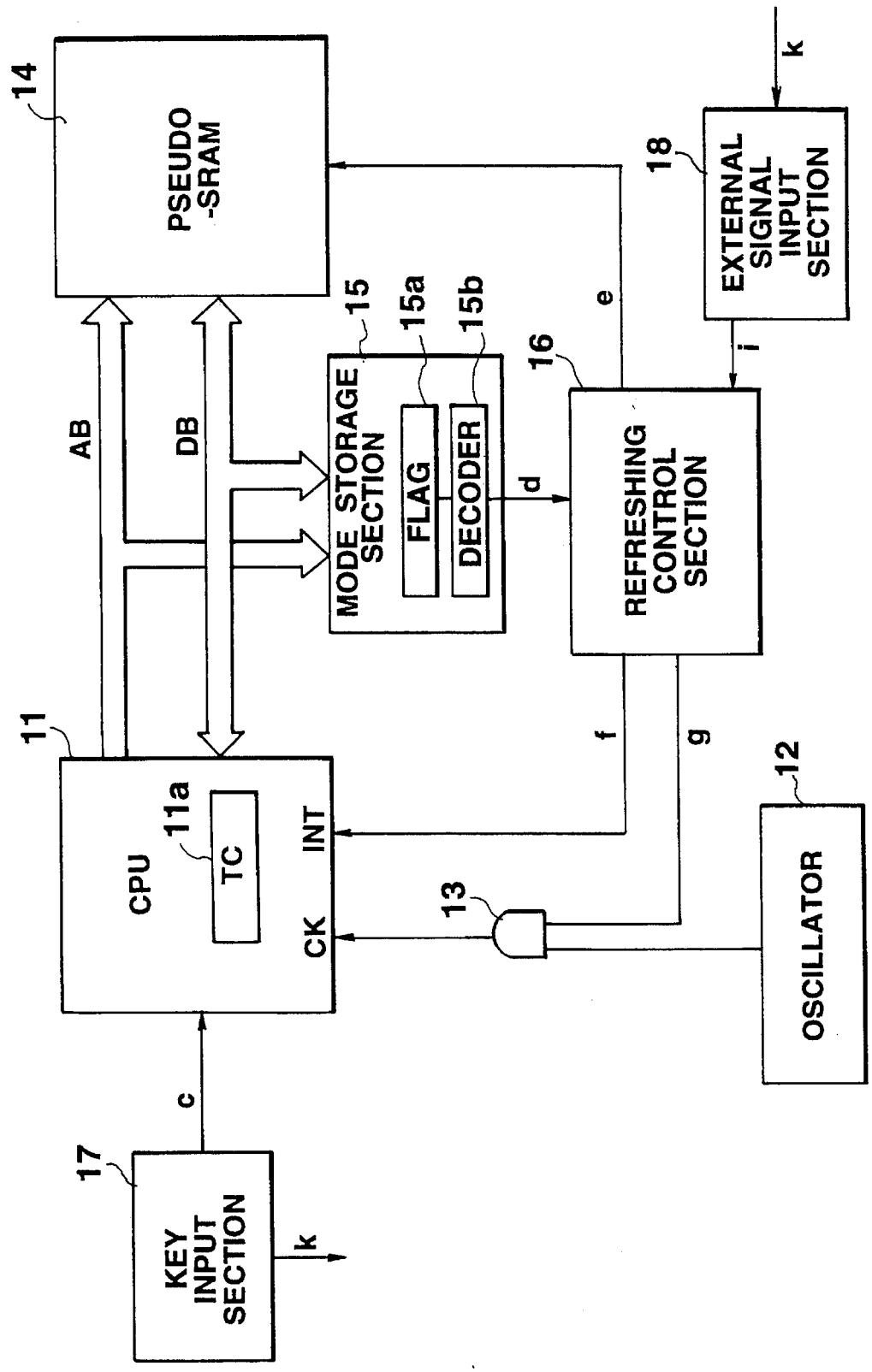
FIG. 1 is a block diagram showing a circuit arrangement according to an embodiment of the present invention.

FIG. 1 shows the basic circuit arrangement of the main part of an electronic device according to an embodiment of the present invention. Reference numeral 11 denotes a CPU for performing a control operation of the entire device. This CPU 11 is operated such that an operation clock generated by an oscillator 12 is input to the CPU 11 through an AND circuit 13. The CPU 11 is connected to a pseudo-SRAM 14 for storing various data and a mode storage section 15 through an address bus AB and a data bus DB. The CPU 11 receives a key signal C from a key input section 17 to perform a process corresponding to a key operation.

The mode storage section 15 stores information corresponding to three modes (to be described later) of the electronic device in a flag memory 15a. The mode information is decoded by a decoder 15b. When an idle mode is set, a signal d is output to a refreshing control section 16.

The refreshing control section 16 controls the pseudo-SRAM 14 and the CPU 11 in accordance with a set mode and outputs an interrupt signal f, a gate control signal g, and a refresh timing pulse e corresponding to a mode state to the CPU 11, the AND circuit 13, and the pseudo-SRAM 14, respectively. On the other hand, the refreshing control section 16 receives a start signal i from an external signal input section 18.

This external signal input section 18 sends the start signal i to the refreshing control section 16 in response to an input of a signal k representing that a key operation is performed with the key input section 17.

Figure 2:
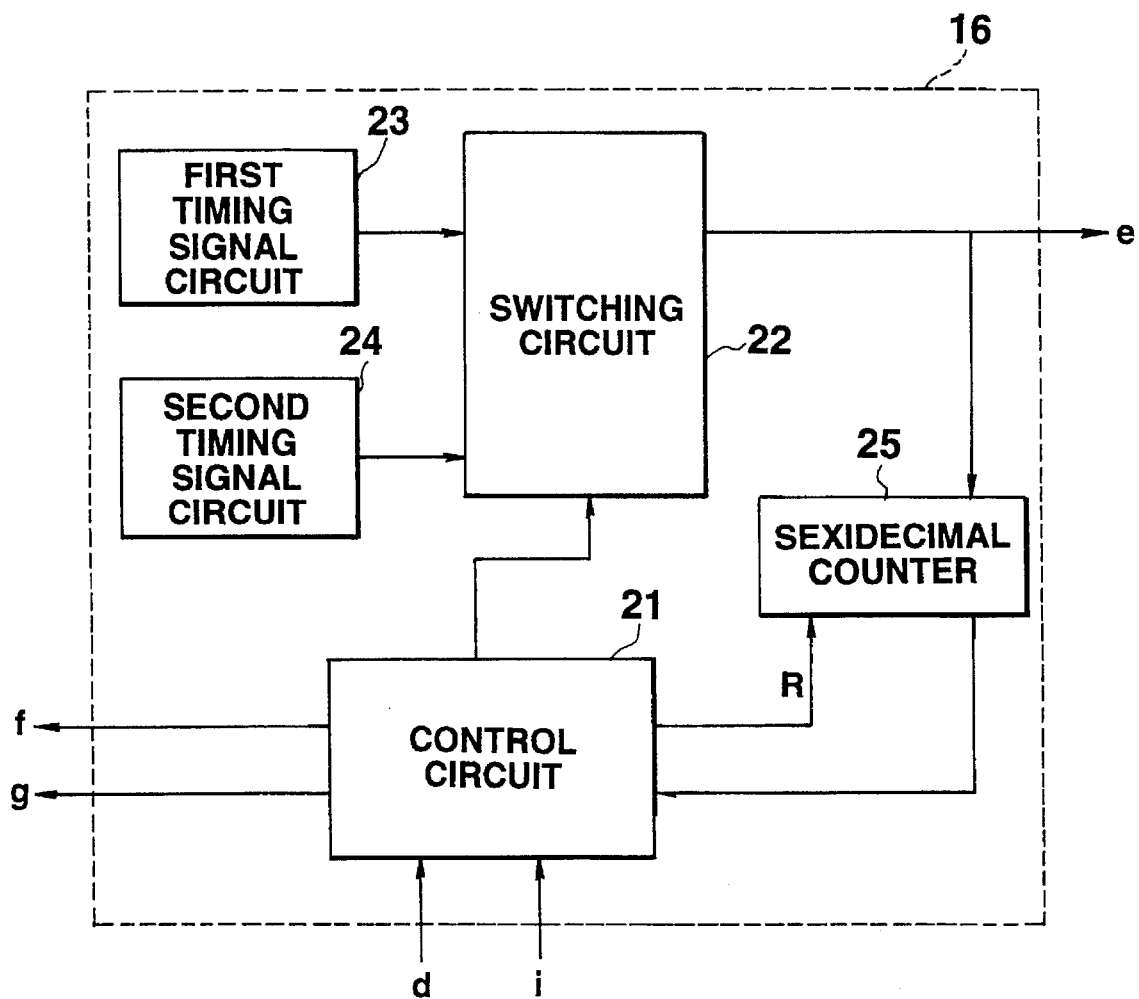
FIG. 2 is a block diagram showing the detailed circuit arrangement in the refreshing control section in FIG. 1.

The detailed circuit arrangement in the refreshing control section 16 will be described below with reference to FIG. 2. Referring to FIG. 2, the idle mode signal d from the mode storage section 15 and the start signal i from the external signal input section 18 are input to a control circuit 21. A carry signal from a sexidecimal counter 25 is input to the control circuit 21. The control circuit 21 generates the interrupt signal f and the gate control signal g on the basis of the mode signal d, the start signal i, and the carry signal, outputs the interrupt signal f and the gate control signal g to the CPU 11 and the AND circuit 13, respectively, and sends a switching/selecting signal to a switching circuit 22.

A timing signal which is sent from a first timing signal circuit 23 for automatically refreshing the pseudo-SRAM 14 or a timing signal which is sent from a second timing signal circuit 24 for refreshing the pseudo-SRAM 14 at a time is selected by the switching circuit 22 in accordance with the selecting signal from the control circuit 21. The selected timing signal is supplied to the pseudo-SRAM 14 and the sexidecimal counter 25 as a refresh timing pulse e.

The sexidecimal counter 25 is reset by the control circuit 21 to count refresh timing pulses e sent through the switching circuit 22. When the count value of the sexidecimal counter 25 becomes 16, the sexidecimal counter 25 sends a carry signal to the control circuit 21.

The operation of the embodiment described above will be described below.

In this device, three modes, i.e., an "active mode" in which the CPU 11 and other circuits are fully operated, an "idle mode" in which a key input waiting state is set to reduce the power consumption of a battery, and a "standby mode" in which a completely suspended state is set by turning off the battery of the electronic device, are set.

In the "active mode", the CPU 11 and the pseudo-SRAM 14 are always operated to perform a process corresponding to a key input operation. The refreshing control section 16 supplies a refresh timing pulse e having a predetermined period to the pseudo-SRAM 14. The pseudo-SRAM 14 backs up its storage contents using an automatic refreshing function which is a conventional technique. At this time, the gate control signal g goes to "H" level, and the gate of the AND circuit 13 is set in an open state. For this reason, an operation clock generated by the oscillator 12 is continuously supplied to the CPU 11 through the AND circuit 13.

In the "idle mode", a gate control signal g output from the refreshing control section 16 goes to "L" level, and the gate of the AND circuit 13 is set in a closed state. For this reason, the operation clock generated by the oscillator 12 is not supplied to the CPU 11, and the CPU 11 is set in a disabled state. At this time, the output of the refresh timing pulse e from the refreshing control section 16 to the pseudo-SRAM 14 is disabled. When the pseudo-SRAM 14 detects the absence of the refresh timing pulse e in a predetermined period of time, the pseudo-SRAM 14 performs a self-refreshing function to back up the storage contents of the pseudo-SRAM 14.

In the "standby mode", since power supply to the circuits except for the pseudo-SRAM 14 is stopped, the pseudo-SRAM 14 performs the self-refreshing function to back up the storage contents of the pseudo-SRAM 14.

An operation for shifting the "active mode" to the "idle mode" and then the "idle mode" to the "active mode" while the power supply of the electronic device is set in an ON state will be described below with reference to FIGS. 3 and 4.

When a key input operation is performed in the "active mode", a time counter 11a in the CPU 11 is reset and the CPU 11 performs a process corresponding to the key operation (steps S1 to S3).

In the "active mode", when a state in which any key input operation is not performed is continued, the count value of the time counter 11a is incremented (steps S1, S4, and S5). When a predetermined period of time, e.g., 5 minutes, has passed, the count-over state of the time counter 11a is detected (step S4), set mode information representing, e.g., "00", the "active mode" stored in the flag memory 15a of the mode storage section 15 is rewritten with set mode information, e.g., "01", representing the "idle mode" (S6).

When the "idle mode" is set, the refreshing control section 16 immediately causes the gate control signal g to the AND circuit 13 to go from "H" level to "L" level in response to the output d from the decoder 15b. Therefore, as shown in (5) in FIG. 4, supply of an operation clock generated by the oscillator 12 to the CPU 11 is interrupted. Subsequently, a timing signal which is for an automatic refreshing function, is output from the first timing signal circuit 23, and has been selected up to this is interrupted, and as shown in (2) in FIG. 4, supply of the refresh timing pulse e to the pseudo-SRAM 14 is disabled.

The characteristics of the pseudo-SRAM 14 will be described below. It is assumed that the pseudo-SRAM 14 must be refreshed at a period of 2048 pulses/32 [ms]. Therefore, the first timing signal circuit 23 generates a first timing signal having a period of one pulse/15 [μs] obtained by averaging the period of 2048 pulses/32 [ms] to use the first timing signal for an automatic refreshing operation, and the first timing signal circuit 23 supplies the generated timing signal to the pseudo-SRAM 14 in the "active mode". In this state, the current consumption value of the pseudo-SRAM 14 is, e.g., about 300 [μA].

However, in the pseudo-SRAM 14, when a predetermined period of time has passed from when the refresh timing pulse e is disabled, the self-refreshing function is started, and the storage contents are backed up by an internal circuit (not shown) of the pseudo-SRAM 14 with minimum current consumption.

In the "idle mode", since no operation clock is supplied to the CPU 11, the power consumption of the CPU 11 becomes "0". In addition, since the pseudo-SRAM 14 consumes only a minimum current, e.g., a current of about 30 [μA], required to back up the storage contents of the pseudo-SRAM 14 using the self-refreshing function, the power consumption of the entire circuit can be considerably reduced.

When a key input operation is performed, the signal k representing that a key input operation is performed is input to the external signal input section 18. The external signal input section 18 which receives the signal k causes the start signal i to the refreshing control section 16 to go to "H" level as shown in (3) in FIG. 4.

In response to the start signal i, the control circuit 21 of the refreshing control section 16 causes the switching circuit 22 to select a second timing signal output from the second timing signal circuit 24 for a refreshing-at-a-time operation, and supplies the second timing signal to the pseudo-SRAM 14 and the sexidecimal counter 25 as shown in (2) in FIG. 4.

The second timing signal output from the second timing signal circuit 24 for the refreshing-at-a-time operation has a period of, e.g., about 16 pulses/10 [μs]. It is assumed that the second timing signal is a timing signal having a frequency considerably higher than that of the first timing signal used for the automatic refreshing operation.

When 16 second timing signals output from the second timing signal circuit 24 are supplied to the pseudo-SRAM 14 as the refresh timing pulses e for 10 [μs], a refreshing operation is not required for 230 [μs] after the 16 second signals are supplied, as indicated by a calculation of "15 [μs]×16−10 [μs]=230 [μs]".

The sexidecimal counter 25 counts second timing signals output from the second timing signal circuit 24 after the sexidecimal counter 25 is reset by the reset signal R of the control circuit 21, and sends a carry signal to the control circuit 21 when the count value of the sexidecimal counter 25 is set to be "16".

In response to the carry signal from the sexidecimal counter 25, the control circuit 21 causes the gate control signal g which is to be supplied to the AND circuit 13 and has been set at "L" level to go to "H" level, so as to restart supply of an operation clock generated by the oscillator 12 to the CPU 11 as shown in (5) in FIG. 4. At the same time, as shown in (4) in FIG. 4, the control circuit 21 sends a pulse serving as an interrupt signal f to the CPU 11 to perform a starting process in a restart state.

Figure 3:
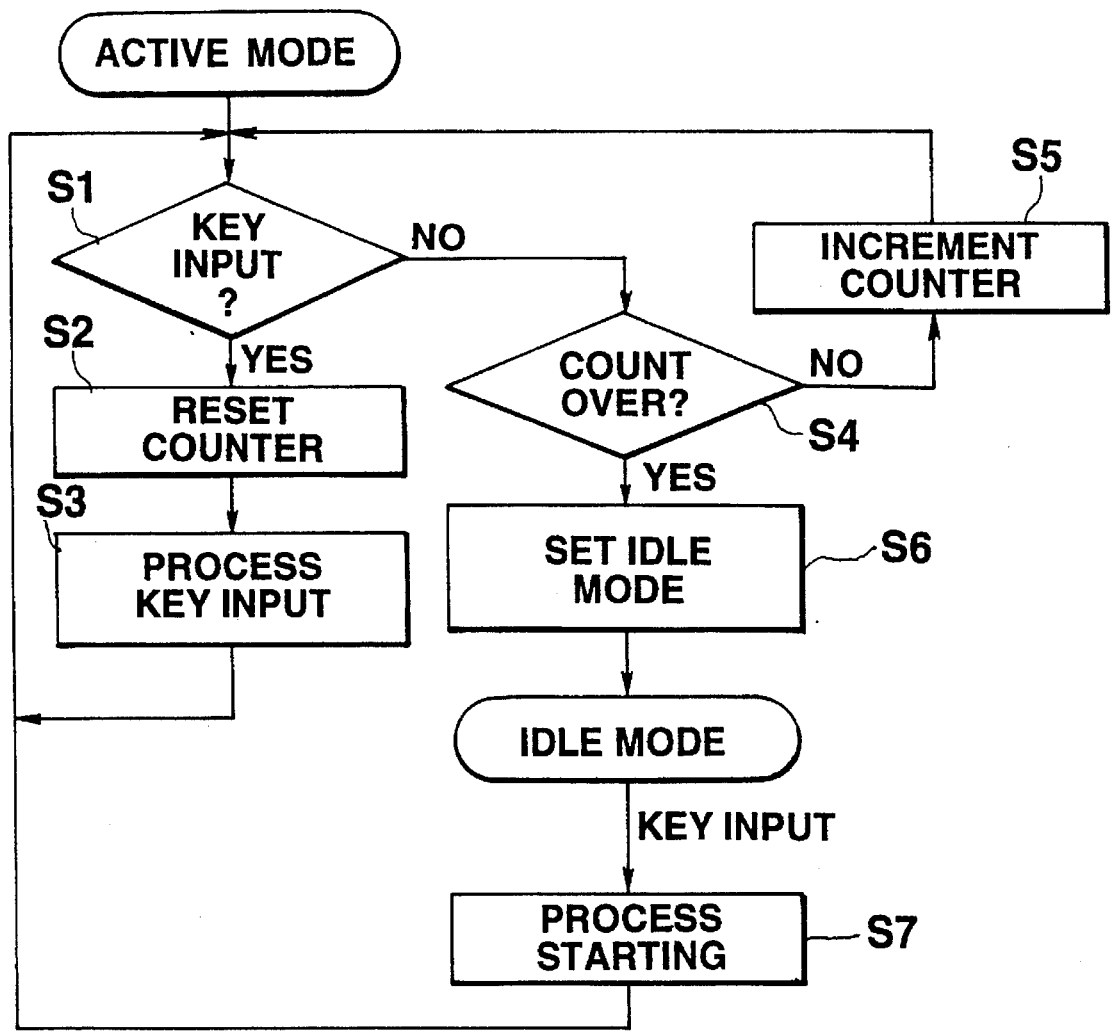
FIG. 3 is a flow chart showing the operation of this embodiment device when an active mode is switched to an idle mode.

However, in the CPU 11, the starting process in the restart state is performed in accordance with the interrupt signal f (step S7 of FIG. 3). At this time, since the pseudo-SRAM 14 need not be refreshed for 230 [μs] because the refreshing-at-a-time operation is performed, the CPU 11 can involve in the starting process with a time margin. The CPU 11 performs the starting process and rewrites set mode information, e.g., "01", representing the "idle mode" and stores in the mode storage section 15 with set mode information, e.g., "00", representing the "active mode", thereby returning to the "active mode" again.

Subsequently, upon completion of the starting process of the CPU 11, before the period of time (230 [μs]) which requires no refreshing operation has passed, the control circuit 21 causes the switching circuit 22 to select the first timing signal output from the first timing signal circuit 23 for an automatic refreshing operation, and the control circuit 21 supplies the first timing signal to the pseudo-SRAM 14.

Although the "standby mode" is a mode in which the power supply is turned off to perform the self-refreshing function of the pseudo-SRAM 14, a description of the self-refreshing function will be omitted because the self-refreshing function of the pseudo-SRAM is known well.

As has been described above, according to the present invention, when the CPU waits for a key input operation for a long period of time in the operation state of the electronic device, the "idle mode" is set, power is prevented from being wasted. Thereafter, when a key input operation is performed, the state of the electronic device including the contents of the memory can be rapidly returned to the operation state set before the CPU waits for the key input operation.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An electronic device comprising:
   a CPU which controls an operation of said electronic device, said CPU functioning in an active mode in which said CPU operates and in an idle mode in which said CPU does not operate;
   a pseudo-SRAM connected to said CPU and having a self-refreshing function;
   storage means for storing data denoting the active mode in which said CPU operates and the idle mode in which said CPU does not operate;
   refresh signal supplying means for supplying a first refresh timing signal of a predetermined period to cause said pseudo-SRAM to perform an automatic refreshing operation when said CPU is in the active mode, for stopping supply of the first refresh timing signal when said CPU is in the idle mode, and for supplying, when the idle mode of said CPU is switched to the active mode of said CPU, a second refresh timing signal having a period shorter than that of the first refresh timing signal for a predetermined interval of time.

2. A device according to claim 1, wherein an operation clock is supplied to said CPU when said CPU is in the active mode, and said device further comprises means for stopping supply of the operation clock to said CPU when said CPU is in the idle mode.

3. A device according to claim 2, further comprising:
   key input means for performing a key operation;
   detection means for detecting that no key input operation is performed by said key input means for a predetermined period of time; and
   means for switching a mode of operation of said CPU from the active mode to the idle mode when said detection means detects that no key input operation is performed by said key input means for the predetermined period of time.

4. A device according to claim 3, wherein:
   said detection means includes means for detecting that a key input operation of said key input means is performed when said CPU is in the idle mode; and
   said means for switching includes means for switching a mode of operation of said CPU from the idle mode to the active mode when said detection means detects that a key input operation of said key input means is performed when said CPU is in the idle mode.

5. A device according to claim 1, wherein said refresh signal supplying means comprises:
   a first signal generation circuit which generates the first refresh timing signal;
   a second signal generation circuit which generates the second refresh timing signal; and
   a switching circuit which controls transfer of the first and second refresh timing signals.

6. A device according to claim 5, wherein:
   said refresh signal supplying means further comprises a counter for counting pulses of the second refresh timing signal; and
   said switching circuit comprises means for switching from the second to the first refresh timing signal upon count-up of said counter to a predetermined number.

7. An electronic device comprising:
   key input unit;
   a CPU for performing a process corresponding to a key operation of said key input unit;
   a pseudo-SRAM having a self-refreshing function;
   detection means for detecting a presence of performance of a key operation on said key input unit; and
   refresh timing signal control means for supplying a first refresh timing signal having a predetermined period to said pseudo-SRAM in an operation state of said CPU, for stopping supply of the first refresh timing signal when no key operation on said key input unit is detected by said detection means for a predetermined period of time, and for supplying a second refresh timing signal having a period shorter than that of the first refresh timing signal for an interval of time, when said detection means detects a presence of a key operation on said key input unit.

8. A device according to claim 7, further comprising:
   first signal generation means for generating the first refresh timing signal; and
   second signal generation means for generating the second refresh timing signal.

9. A device according to claim 8, wherein said refresh timing signal control means further comprises:

a counter for counting the number of timing signals generated by said second signal generation means; and a switching circuit for switching from the second to the first timing signal when said counter counts up to a predetermined number.

10. A device according to claim 9, further comprising:

means for storing operation modes of said electronic device, the operation modes including an active mode in which said CPU is operated to perform a process and an idle mode in which said CPU is not operated.

11. A device according to claim 10, further comprising:

means for switching a mode of operation of said CPU from the active mode of said CPU to the idle mode of said CPU, when said detection means detects that no key input operation is performed by said key input unit for the predetermined period of time.

12. A device according to claim 7, wherein an operation clock is supplied to said CPU, and said device further comprises means for stopping supply of the first refresh timing signal and stopping supply of the operation clock to said CPU when said CPU is not performing a process.

* * * * *